United States Patent
Yu et al.

(10) Patent No.: US 10,104,816 B2
(45) Date of Patent: Oct. 16, 2018

(54) BOARD, SEMICONDUCTOR FABRICATION PLANT (FAB) AND FABRICATION FACILITY

(71) Applicant: TAIWAN SEMICONDUCTOR MANUFACTURING CO., LTD., Hsinchu (TW)

(72) Inventors: Chwen Yu, Taipei (TW); Chih-Ming Tsao, Miaoli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 284 days.

(21) Appl. No.: 15/017,559

(22) Filed: Feb. 5, 2016

(65) Prior Publication Data

US 2017/0229278 A1    Aug. 10, 2017

(51) Int. Cl.
*H05K 9/00* (2006.01)
*G12B 17/00* (2006.01)
*G12B 17/02* (2006.01)
*H01J 37/09* (2006.01)
*H01J 37/30* (2006.01)

(52) U.S. Cl.
CPC ............. *H05K 9/00* (2013.01); *G12B 17/00* (2013.01); *G12B 17/02* (2013.01); *H05K 9/0001* (2013.01); *H01J 37/09* (2013.01); *H01J 37/3002* (2013.01)

(58) Field of Classification Search
CPC .......... G12B 17/00; G12B 17/02; H05K 9/00; H05K 9/0001
See application file for complete search history.

(56) References Cited

U.S. PATENT DOCUMENTS

| | | | | |
|---|---|---|---|---|
| 5,043,529 A | * | 8/1991 | Vanesky | A61B 5/04005 174/363 |
| 2012/0146752 A1 | * | 6/2012 | Fullerton | H01F 7/0205 335/306 |
| 2014/0225702 A1 | * | 8/2014 | Yazaki | H01F 17/0013 336/200 |
| 2014/0340030 A1 | * | 11/2014 | Jung | H02J 7/025 320/108 |
| 2014/0362505 A1 | * | 12/2014 | Jang | H05K 9/0075 361/679.4 |

FOREIGN PATENT DOCUMENTS

| | | | | |
|---|---|---|---|---|
| JP | 05095197 A | * | 4/1993 | |
| JP | 05341066 A | * | 12/1993 | |
| KR | 1178132 B1 | * | 8/2012 | |
| WO | WO 2006077417 A2 | * | 7/2006 | H05K 9/0001 |

* cited by examiner

*Primary Examiner* — Mohamad Musleh
(74) *Attorney, Agent, or Firm* — Maschoff Brennan (57) ABSTRACT

A board includes a first magnetic conductive plate and a second magnetic conductive plate. The first magnetic conductive plate has a first magnetic conductive direction. The second magnetic conductive plate overlaps with the first magnetic conductive plate. The second magnetic conductive plate has a second magnetic conductive direction. The first magnetic conductive direction and the second magnetic conductive direction cross.

9 Claims, 11 Drawing Sheets

BOARD, SEMICONDUCTOR FABRICATION PLANT (FAB) AND FABRICATION FACILITY

BACKGROUND

The present disclosure generally relates to boards.

In different manufacturing industries, boards are practically utilized as partition walls to isolate different machines or equipment from each other. In this way, the operation of one machine or equipment will not influence the operation of the other. Therefore, the efficiency and performance of the machines or equipment being isolated from each other can be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, operations, elements, and/or components, but do not preclude the presence or addition of one or more other features, regions, integers, operations, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
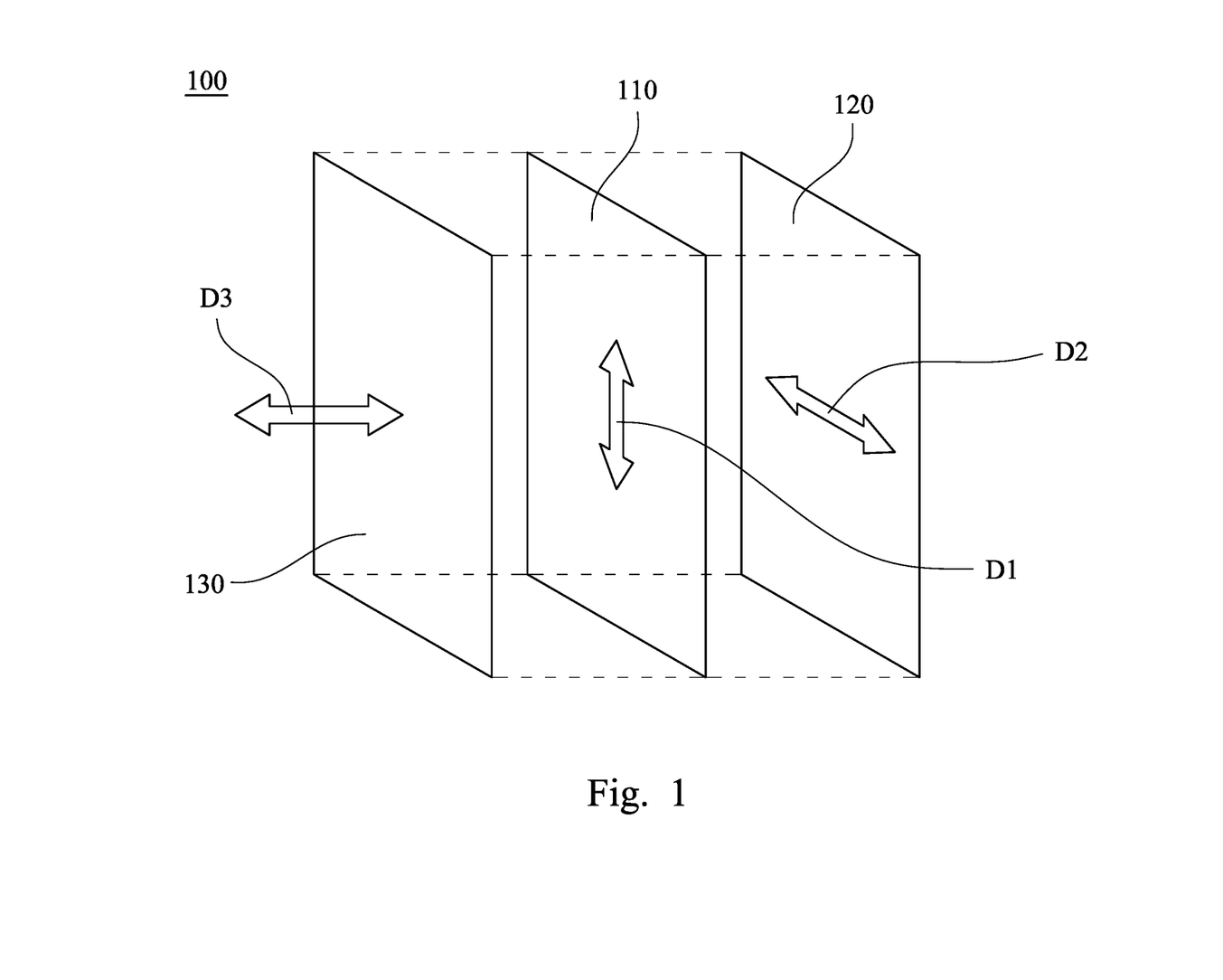
FIG. 1 is an exploded view of a board in accordance with some embodiments of the present disclosure.

Reference is made to FIG. 1. FIG. 1 is an exploded view of a board 100 in accordance with some embodiments of the present disclosure. In some embodiments, as shown in FIG. 1, the board 100 includes a first magnetic conductive plate 110 and a second magnetic conductive plate 120. The first magnetic conductive plate 110 has a first magnetic conductive direction D1. The second magnetic conductive plate 120 overlaps with the first magnetic conductive plate 110. The second magnetic conductive plate 120 has a second magnetic conductive direction D2. The first magnetic conductive direction D1 and the second magnetic conductive direction D2 cross.

Technically speaking, the first magnetic conductive plate 110 concentrates and directs a magnetic field along the first magnetic conductive direction D1 while mitigates the magnetic field in at least one direction other than the first magnetic conductive direction D1, e.g. a direction D3 through the board 100. On the other hand, the second magnetic conductive plate 120 concentrates and directs a magnetic field along the second magnetic conductive direction D2 while mitigates the magnetic field in at least one direction other than the second magnetic conductive direction D2, e.g. the direction D3 through the board 100. In this way, when a magnetic field emitted from a source (not shown in FIG. 1) reaches the board 100, the magnetic field is mitigated and thus shielded by the board 100.

To be more specific, when the magnetic field emitted from the source reaches the first magnetic conductive plate 110, the magnetic field will be concentrated and directed along the first magnetic conductive direction D1. At the same period of time, the magnetic field will be mitigated in at least one direction other than the first magnetic conductive direction D1, e.g. the direction D3 through the board 100. When a magnetic field reaches the second magnetic conductive plate 120, the magnetic field will be concentrated and directed along the second magnetic conductive direction D2. At the same period of time, the magnetic field will be mitigated in at least one direction other than the second magnetic conductive direction D2, e.g. the direction D3 through the board 100. As a result, the magnetic field emitted from the source is mitigated and thus shielded by the board 100.

In addition, in some embodiments, the first magnetic conductive direction D1 and the second magnetic conductive direction D2 are substantially perpendicular to each other. As a result, in some embodiments, when a magnetic field emitted from the source reaches the first magnetic conductive plate 110 of the board 100, the magnetic field will be concentrated and directed along the first magnetic conductive direction D1. At the same period of time, the magnetic field will be mitigated in at least one direction other than the first magnetic conductive direction D1, e.g. the direction D3 through the board 100. As mentioned above, the first magnetic conductive direction D1 and the second magnetic conductive direction D2 are substantially perpendicular to each other. When a magnetic field emitted from the source reaches the second magnetic conductive plate 120 of the board 100, the magnetic field will be concentrated and directed along the second magnetic conductive direction D2 which is substantially perpendicular to the first magnetic conductive direction D1. At the same period of time, the magnetic field will be mitigated in at least one direction other than the second magnetic conductive direction D2, e.g. the direction D3 through the board 100. As a result, the magnetic field is concentrated and directed into a plane determined by the first magnetic conductive direction D1 and the second magnetic conductive direction D2. At the same period of time, the magnetic field will be mitigated in the direction D3 through the plane determined by the first magnetic conductive direction D1 and the second magnetic conductive direction D2. That is, the direction D3 is different from both of the first magnetic conductive direction D1 and the second magnetic conductive direction D2. Thus, provided that the first magnetic conductive direction D1 and the second magnetic conductive direction D2 are disposed at substantially 90 degrees to each other, the magnetic field emitted from the source will be substantially mitigated by the board 100. In this way, the magnetic field emitted from the source is mitigated and thus shielded by the board 100.

Furthermore, in some embodiments, the board 100 further includes a magnetic shielding structure 130. As shown in FIG. 1, in some embodiments, the first magnetic conductive plate 110 is present between the magnetic shielding structure 130 and the second magnetic conductive plate 120. In some other embodiments, the second magnetic conductive plate 120 is present between the magnetic shielding structure 130 and the first magnetic conductive plate 110. The magnetic shielding structure 130 is capable of at least partially shielding the magnetic field in at least the direction D3 through the magnetic shielding structure 130. Theoretically speaking, the magnetic shielding structure 130 works to mitigate the magnetic field by absorbing and changing an energy of the magnetic field into an eddy current which is then dissipated in the form of heat. In practical applications, the magnetic shielding structure 130 is made of metal, such as aluminum, with a thickness ranging from about 3 mm to about 6 mm. In this way, in the structural point of view, the magnetic shielding structure 130 further provides a mechanical protection to the first magnetic conductive plate 110 and the second magnetic conductive plate 120. Thus, the board 100 becomes structurally stronger.

To be more specific, as shown in FIG. 1, the first magnetic conductive plate 110 overlaps with the magnetic shielding structure 130. Meanwhile, the first magnetic conductive direction D1 of the first magnetic conductive plate 110 is different from the direction D3 through the magnetic shielding structure 130. In this way, the magnetic shielding structure 130 and the first magnetic conductive plate 110 both mitigate the magnetic field in the direction D3. As a result, the magnetic field is mitigated and thus shielded by the board 100.

In some embodiments, the direction D3 through the magnetic shielding structure 130 is substantially perpendicular to the first magnetic conductive direction D1 of the first magnetic conductive plate 110. In this way, the magnetic field in the direction D3 substantially perpendicular to the first magnetic conductive plate 110 is substantially mitigated by the magnetic shielding structure 130.

As mentioned above, the second magnetic conductive plate 120 overlaps with the first magnetic conductive plate 110. Therefore, the magnetic shielding structure 130 overlapping with the first magnetic conductive plate 110 also means that the second magnetic conductive plate 120 overlaps with the magnetic shielding structure 130. The second magnetic conductive direction D2 of the second magnetic conductive plate 120 is different from the direction D3 through the magnetic shielding structure 130. In this way, similarly, the magnetic shielding structure 130 and second magnetic conductive plate 120 both mitigate the magnetic field in the direction D3. As a result, the magnetic field is mitigated and thus shielded by the board 100.

Structurally speaking, in some embodiments, the first magnetic conductive plate 110 is substantially parallel with the second magnetic conductive plate 120. To be more specific, as shown in FIG. 1, the direction D3 through the magnetic shielding structure 130 being substantially perpendicular to the first magnetic conductive plate 110 also means that the direction D3 is substantially perpendicular to the second magnetic conductive plate 120. In this way, the magnetic field in the direction D3 is substantially mitigated by at least both of the magnetic shielding structure 130 and the second magnetic conductive plate 120.

Technically speaking, at least one of the first magnetic conductive plate 110 and the second magnetic conductive plate 120 is capable to concentrate and direct a magnetic field because at least one of the first magnetic conductive plate 110 and the second magnetic conductive plate 120 has a grain orientation. The grain orientations respectively define the orientation of the grains of the first magnetic conductive plate 110 and the orientation of the grains of the second magnetic conductive plate 120. As mentioned above, the first magnetic conductive direction D1 and the second magnetic conductive direction D2 cross. This means that the grain orientation of the first magnetic conductive plate 110 is different from the grain orientation of the second magnetic conductive plate 120. In some embodiments, as mentioned above, the first magnetic conductive direction D1 and the second magnetic conductive direction D2 are substantially perpendicular to each other. This means that the grain orientation of the first magnetic conductive plate 110 is substantially perpendicular to the grain orientation of the second magnetic conductive plate 120.

In practical applications, the first magnetic conductive plate 110 and the second magnetic conductive plate 120 can be made of silicon steel (Si-steel), with a thickness ranging from about 0.2 mm to about 0.5 mm. The material of silicon steel allows the first magnetic conductive plate 110 and the second magnetic conductive plate 120 to be capable to concentrate and direct a magnetic field. However, in some embodiments, other choices of materials can be used for the first magnetic conductive plate 110 and the second magnetic conductive plate 120 according to actual situations.

On the other hand, in some embodiments, the magnetic shielding structure 130 is a magnetic shielding plate. In other words, the magnetic shielding structure 130 has a plate shape. With the magnetic shielding structure 130 in a plate shape, the first magnetic conductive plate 110 and the second magnetic conductive plate 120 together can conveniently allow the board 100 to be in the form of a laminated structure as shown in FIG. 1.

Figure 2:
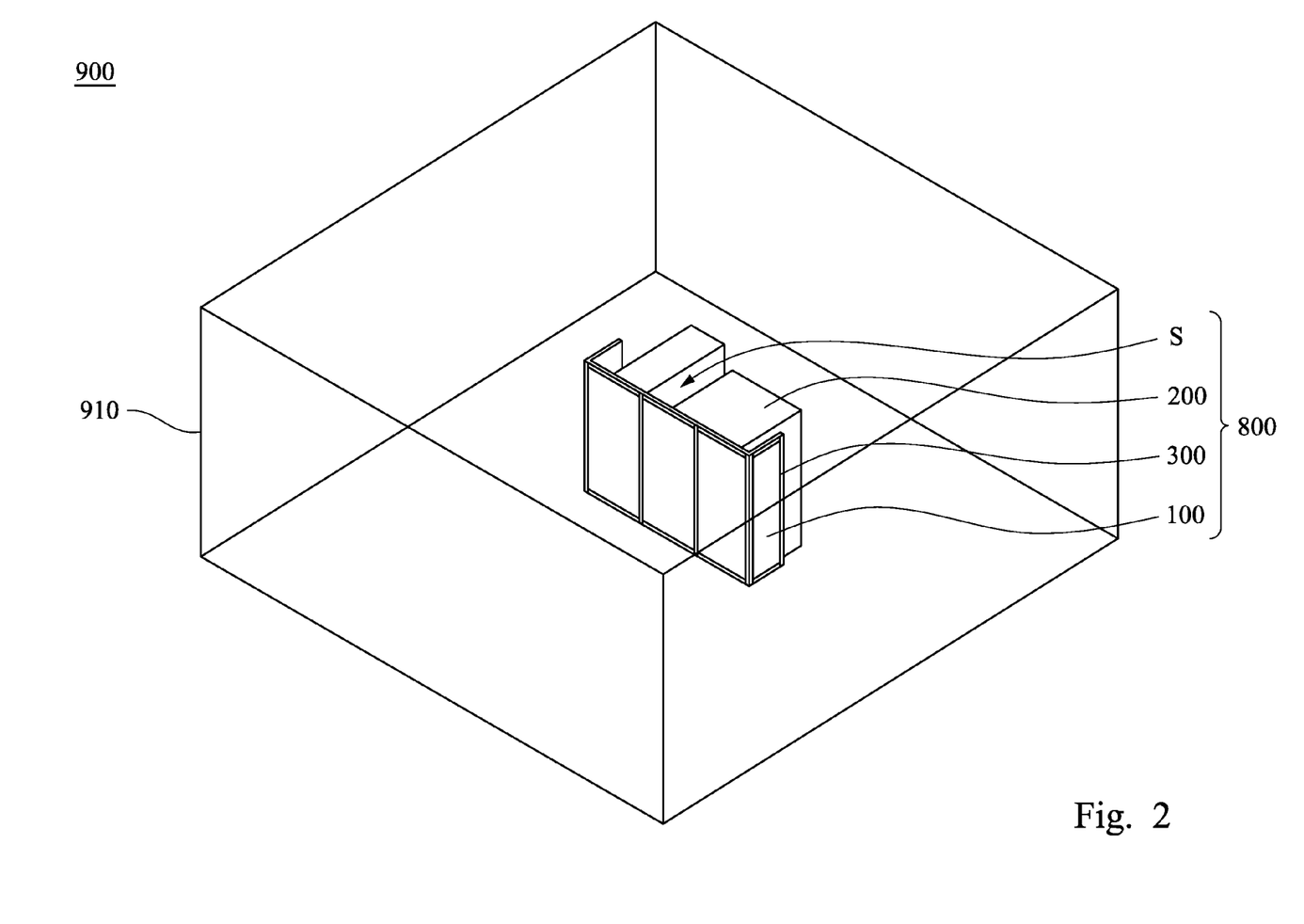
FIG. 2 is a schematic view of a fabrication facility in a semiconductor fabrication plant (FAB) in accordance with some embodiments of the present disclosure.

Reference is made to FIG. 2. FIG. 2 is a schematic view of a fabrication facility 800 in a semiconductor fabrication plant (FAB) 900 in accordance with some embodiments of the present disclosure. In some embodiments, as shown in FIG. 2, the semiconductor fabrication plant 900 includes a housing structure 910 and the fabrication facility 800. The fabrication facility 800 in the semiconductor fabrication plant 900 includes at least one magnetism sensitive tool 200 and the board 100. The magnetism sensitive tool 200 is disposed in the housing structure 910. The board 100 is disposed at least partially around the magnetism sensitive tool 200 in the housing structure 910. To be more specific, the magnetism sensitive tool 200 is present in a space S. The board 100 is disposed on at least one side of the space S. The board 100 includes the first magnetic conductive plate 110 and the second magnetic conductive plate 120 therein. The first magnetic conductive plate 110 has the first magnetic conductive direction D1. The second magnetic conductive plate 120 has the second magnetic conductive direction D2. The first magnetic conductive direction D1 is different from the second magnetic conductive direction D2. The board 100 at least partially shields the space S from the magnetic field.

In other words, the board 100 in the form of a laminated structure can be applied to shield the magnetism sensitive tool 200 from being affected by at least one source (not shown in FIG. 2) of magnetic field in the semiconductor fabrication plant 900. The magnetism sensitive tool 200 is used for carrying out at least one magnetism sensitive operation. The magnetism sensitive operation is an operation which is sensitive to the magnetic field from the surrounding sources. Hence, the result of the magnetism sensitive operation can be affected by the magnetic field. In some embodiments, the magnetism sensitive tool 200 can be an electronic beam (e-beam) tool such as an e-beam writer, a critical dimension—scanning electron microscopy (CD-SEM), a transmission electron microscopy (TEM), or the like. On the other hand, the source of magnetic field may be a power cable tray, an automated material handling system (AMHS), or the like in the semiconductor fabrication plant 900.

Furthermore, as shown in FIG. 2, the fabrication facility 800 further includes at least one frame 300. The frame 300 is assembled with the board 100 to become a partition wall for the space S. In other words, the board 100 in the form of a laminated structure can be assembled with the frame 300 to form a structure of partition wall for the space S. The board 100 and the frame 300 as the partition wall shield the magnetism sensitive tool 200 in the space S to prevent the magnetism sensitive tool 200 from being affected by the magnetic field from the surrounding sources. In addition, a plurality of the frames 300 assembled with a plurality of the boards 100 can be connected together such that the boards 100 as structures of partition walls stand and surround the magnetism sensitive tool 200. In this way, the boards 100 as structures of partition walls can at least partially shield against the magnetic field emitted by the sources surrounding the magnetism sensitive tool 200 in the semiconductor fabrication plant 900. Therefore, the boards 100 as structures of partition walls can effectively protect the magnetism sensitive tool 200 from being affected by the magnetic field from the surrounding sources.

Figure 3:
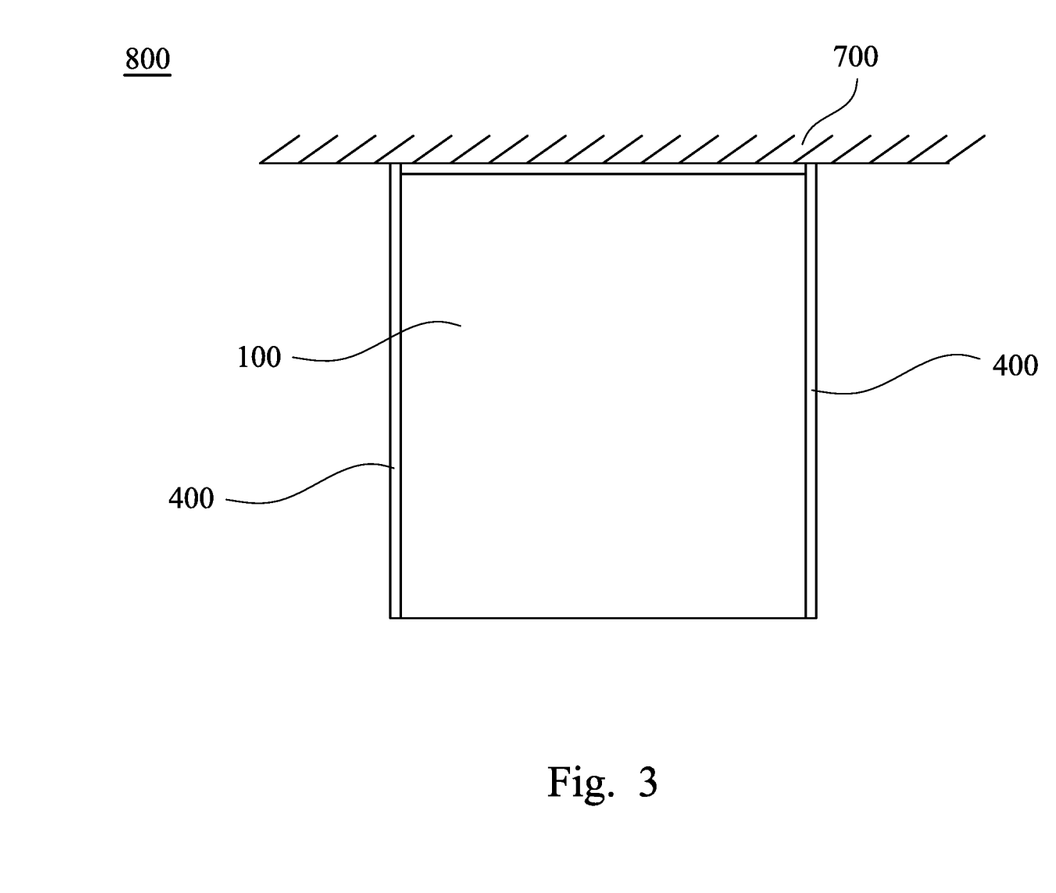
FIG. 3 is a schematic view of another application of the board of FIG. 1.

Reference is made to FIG. 3. FIG. 3 is a schematic view of another application of the board 100 of FIG. 1. In some embodiments, the fabrication facility 800 includes at least one post 400. The post 400 is assembled with the board 100 to become a screen for the space S. Furthermore, as shown in FIG. 3, the board 100 is assembled with two posts 400 to form the screen, in which the board 100 is located between the posts 400. In practical applications, the posts 400 can be mounted to a ceiling 700 such that the board 100 can be conveniently disposed as the screen against the magnetic field from the surrounding sources. In some other embodiments, the posts 400 are mounted to a floor instead.

Figure 4:
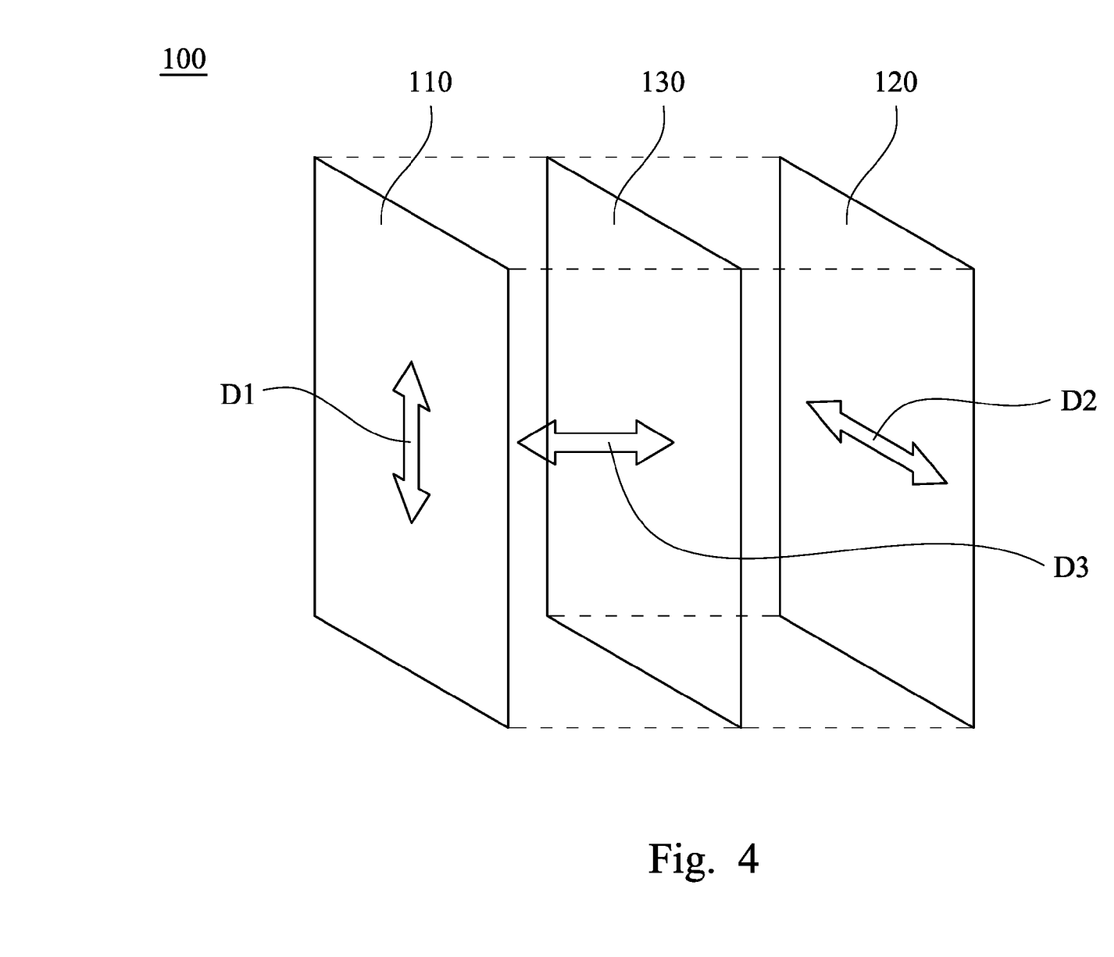
FIGS. 4-7 are exploded views of the board in accordance with some other embodiments of the present disclosure.

Reference is made to FIG. 4. FIG. 4 is an exploded view of the board 100 in accordance with some other embodiments of the present disclosure. In some embodiments, as shown in FIG. 4, the magnetic shielding structure 130 is present between the first magnetic conductive plate 110 and the second magnetic conductive plate 120 according to actual situations. In summary, with respect to the embodiments as mentioned above, there are three different ways of arrangement of the first magnetic conductive plate 110, the second magnetic conductive plate 120 and the magnetic shielding structure 130. Firstly, the first magnetic conductive plate 110 is present between the second magnetic conductive plate 120 and the magnetic shielding structure 130. Secondly, the second magnetic conductive plate 120 is present between the first magnetic conductive plate 110 and the magnetic shielding structure 130. Thirdly, as shown in FIG. 4, the magnetic shielding structure 130 is present between the first magnetic conductive plate 110 and the second magnetic conductive plate 120.

Figure 5:
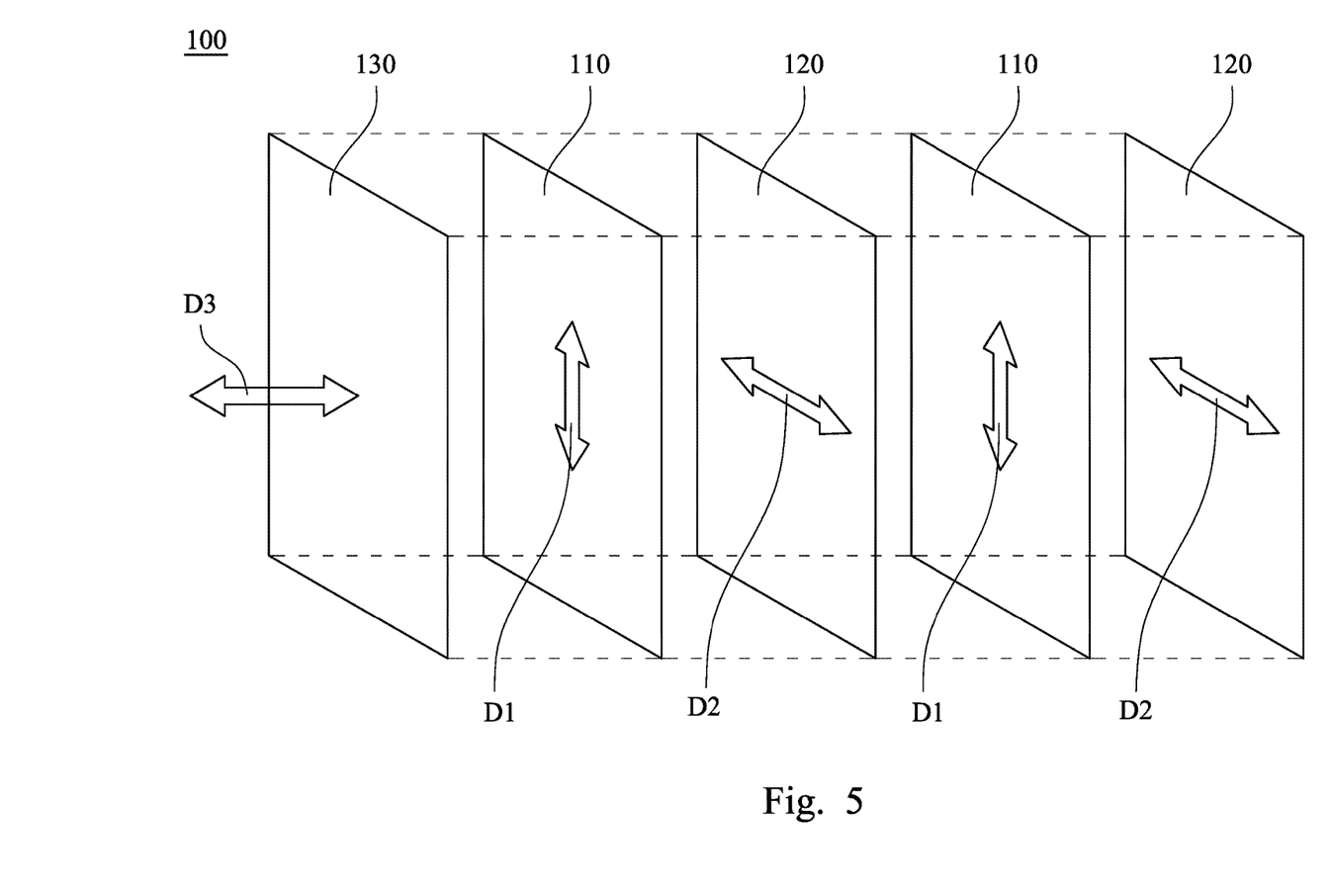

Reference is made to FIG. 5. FIG. 5 is an exploded view of the board 100 in accordance with some other embodiments of the present disclosure. In some embodiments, as shown in FIG. 5, the board 100 includes two sets of the first magnetic conductive plate 110 and the second magnetic conductive plate 120 such that the magnetic shielding structures 130 is present at a side of the two sets of the first magnetic conductive plate 110 and the second magnetic conductive plate 120. In this way, the effectiveness of the board 100 shielding against a magnetic field in the direction D3 is increased.

Figure 6:
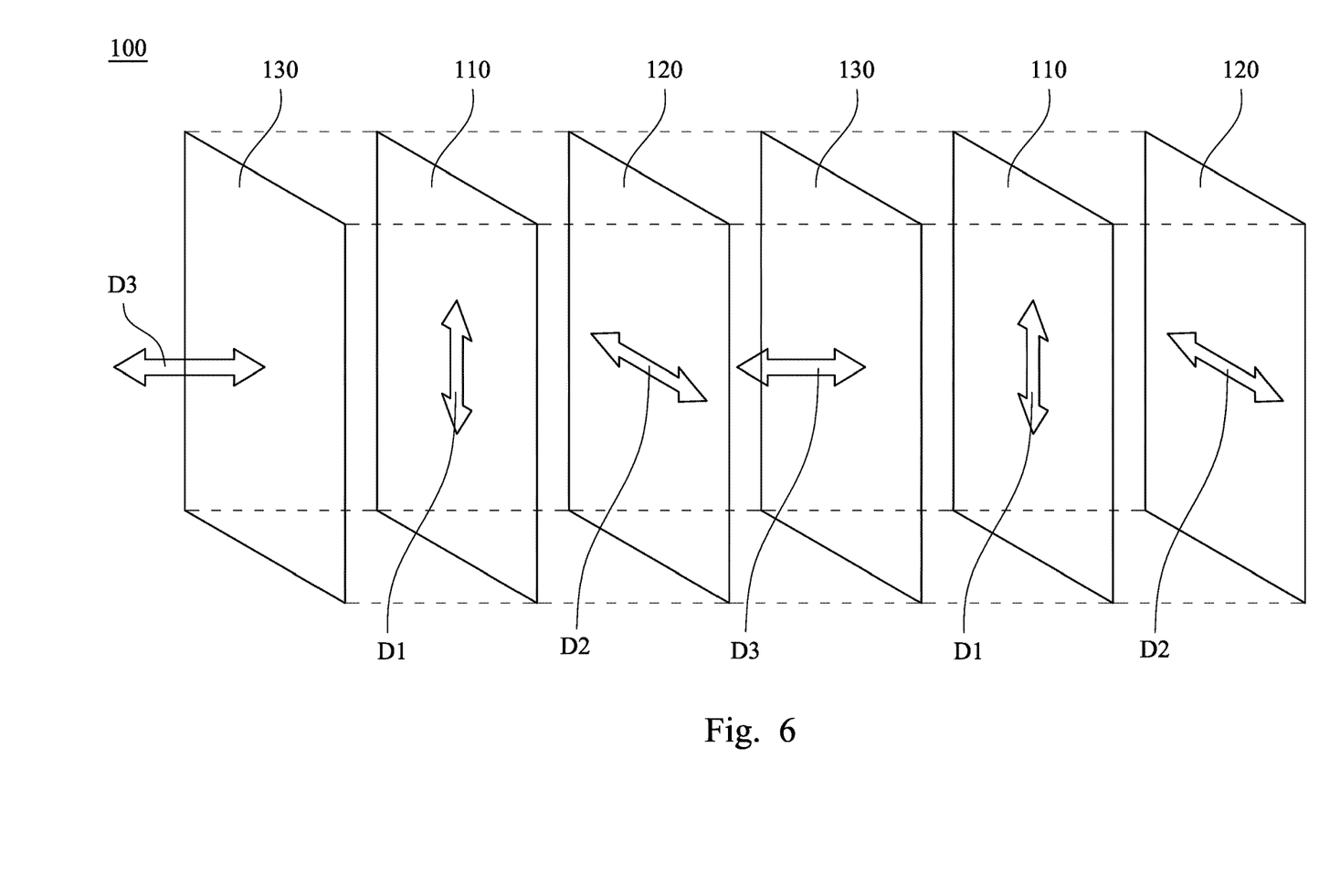

Reference is made to FIG. 6. FIG. 6 is an exploded view of the board 100 in accordance with some other embodiments of the present disclosure. In some embodiments, as shown in FIG. 6, two boards 100 are overlapped together such that the magnetic shielding structures 130 of one of the boards 100 faces to the second magnetic conductive plate 120 of the other board 100. In this way, the effectiveness of the boards 100 shielding against a magnetic field in the direction D3 is increased.

Figure 7:
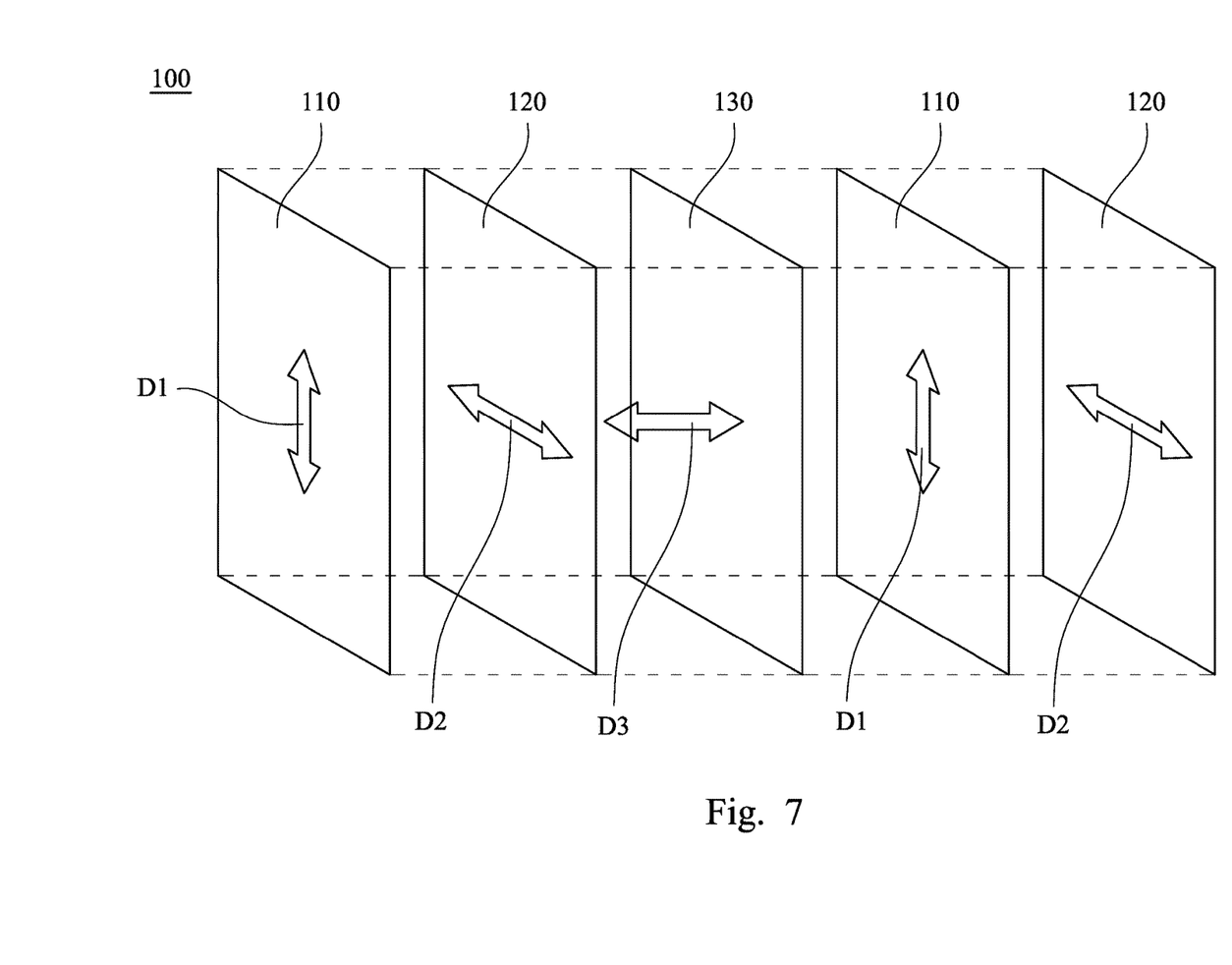

Reference is made to FIG. 7. FIG. 7 is an exploded view of the board 100 in accordance with some other embodiments of the present disclosure. In some embodiments, as shown in FIG. 7, the board 100 includes two sets of the first magnetic conductive plate 110 and the second magnetic conductive plate 120 such that the magnetic shielding structures 130 is present between the two sets of the first magnetic conductive plate 110 and the second magnetic conductive plate 120. To be more specific, there are one first magnetic conductive plate 110 and one second magnetic conductive plate 120 at each side of the magnetic shielding structures 130. In this way, the effectiveness of the board 100 shielding against a magnetic field in the direction D3 is increased.

Figure 8:
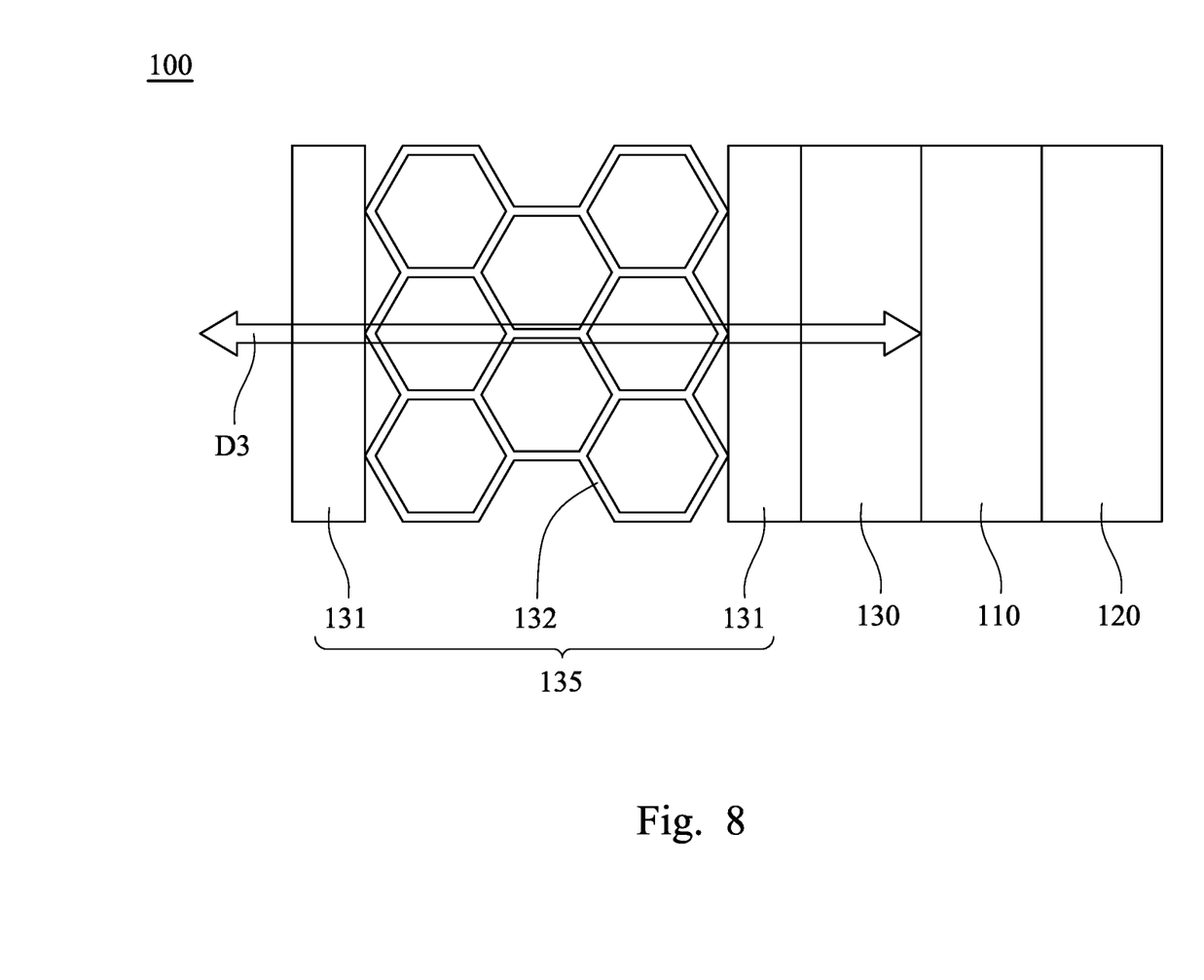
FIGS. 8-10 are sectional views of the board in accordance with some other embodiments of the present disclosure.

Reference is made to FIG. 8. FIG. 8 is a sectional view of the board 100 in accordance with some other embodiments of the present disclosure. In some embodiments, as shown in FIG. 8, the board 100 includes a magnetic shielding structure 135. The magnetic shielding structure 135 is a porous magnetic shielding structure. In practical applications, the magnetic shielding structure 135 can have a honeycomb shape.

To be more specific, as shown in FIG. 8, the magnetic shielding structure 135 includes two structural plates 131 and a core structure 132. The core structure 132 is sandwiched between the structural plates 131. The core structure 132 has a honeycomb shape. In some embodiments, the core structure 132 is made of a material capable of absorbing an energy of a magnetic field. For example, the core structure 132 may be made of aluminum. As a result, the magnetic shielding structure 135 with the core structure 132 sandwiched between the structural plates 131 can shield a magnetic field in the direction D3. In some embodiments, the core structure 132 has a thickness ranging from about 0.2 mm to about 0.8 mm. Meanwhile, in some embodiments, the structural plates 131 can be iron plates. At least one of the structural plates 131 has a thickness ranging from about 0.2 mm to about 0.5 mm.

In practical applications, the magnetic shielding structure 135 with the core structure 132 sandwiched between the structural plates 131 can be used as a partition wall according to actual situations.

In some embodiments, the magnetic shielding structure 130 of the board 100 can have a plate shape, as mentioned above. As shown in FIG. 8, the magnetic shielding structure 130 may be attached on the magnetic shielding structure 135. That is, the magnetic shielding structure 130 overlaps with the magnetic shielding structure 135. Meanwhile, the first magnetic conductive plate 110 and the second magnetic conductive plate 120 are located at a side of the magnetic shielding structure 130 opposite to the magnetic shielding structure 135. In this way, the effectiveness of the board 100 shielding against a magnetic field in the direction D3 is increased.

Figure 9:
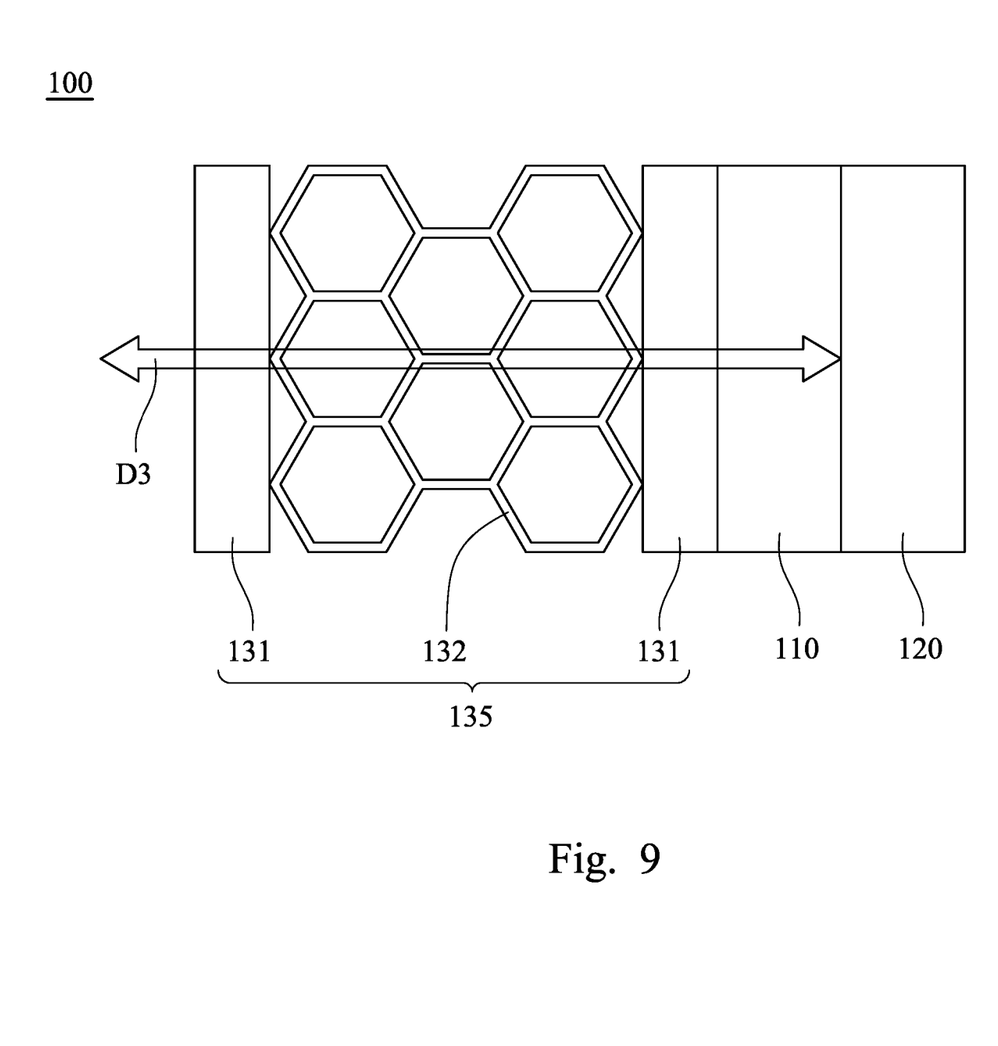

Reference is made to FIG. 9. FIG. 9 is a sectional view of the board 100 in accordance with some other embodiments of the present disclosure. In some embodiments, as shown in FIG. 9, the first magnetic conductive plate 110 and the second magnetic conductive plate 120 may be attached on the magnetic shielding structure 135 with the core structure 132 sandwiched between the structural plates 131. That is, the first magnetic conductive plate 110 and the second magnetic conductive plate 120 overlap with the magnetic shielding structure 135. In this way, the magnetic field in the direction D3 can be shielded by the first magnetic conductive plate 110, the second magnetic conductive plate 120 and/or the core structure 132.

Figure 10:
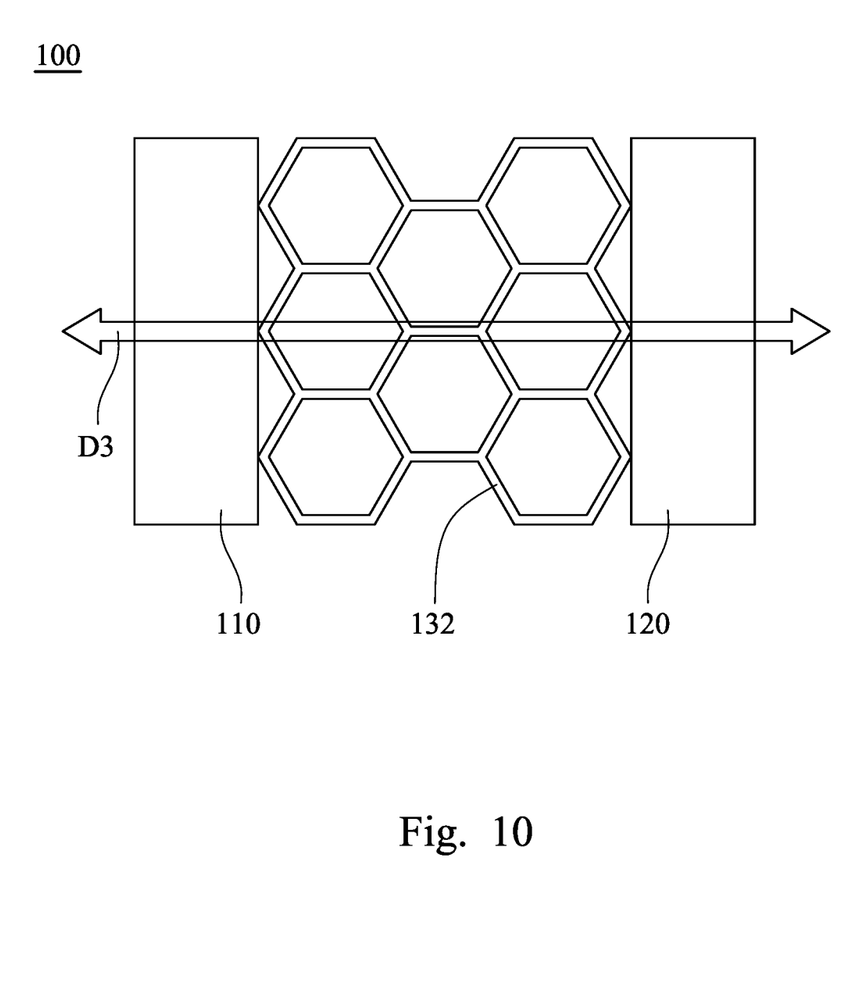

Reference is made to FIG. 10. FIG. 10 is a sectional view of the board 100 in accordance with some other embodiments of the present disclosure. In some embodiments, as shown in FIG. 10, the structural plates 131 may be omitted, and the core structure 132 may be sandwiched between the first magnetic conductive plate 110 and the second magnetic conductive plate 120. In this way, the magnetic field in the direction D3 can be shielded by the first magnetic conductive plate 110, the second magnetic conductive plate 120 and/or the core structure 132 as well.

A series of tests were run to determine that the aforementioned board could shield against the magnetic field. The boards of FIG. 1 stood on three sides of a magnetic field sensor. The magnetic shielding structure of the board is an aluminum plate with a thickness of 3 mm, the first magnetic conductive plate of the board is a silicon steel plate with a thickness of 0.3 mm, and the second magnetic conductive plate of the board is a silicon steel plate with a thickness of 0.3 mm. A pump and an alternating current magnetic field generator were located outside a space defined by the boards where the magnetic field sensor is located. The pump generated a magnetic field of 5.0 mG at 60 Hz, and the alternating current magnetic field generator generated a magnetic field of 2.7 mG at 9 kHz. The reading of the magnetic field sensor was found to be 2.0 mG at 60 Hz and 0.7 mG at 9 kHz.

Figure 11:
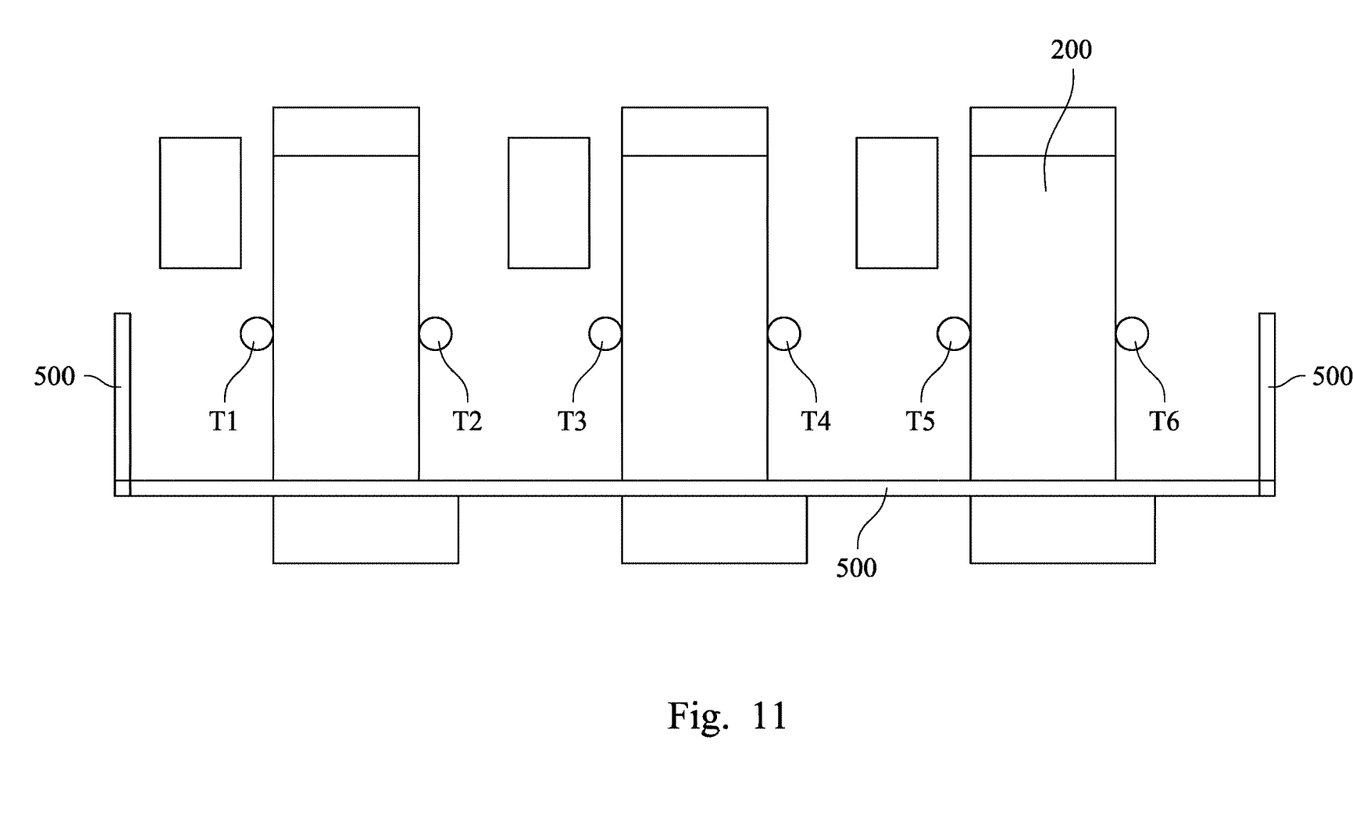
FIG. 11 is a schematic diagram for the partition walls and the e-beam tools under the series of tests.

Reference is made to FIG. 11. FIG. 11 is a schematic diagram for the partition walls 500 and the e-beam tools 200 under the series of tests. As shown in FIG. 11, the partition walls 500 stood and surrounded the e-beam tools 200. The partition walls 500 have aluminum honeycomb core structures. The magnetic shielding structure of the board is an aluminum plate with a thickness of 3 mm, the first magnetic conductive plate of the board is a silicon steel plate with a thickness of 0.3 mm, and the second magnetic conductive plate of the board is a silicon steel plate with a thickness of 0.3 mm. The boards were respectively embedded inside the partition walls 500. The strengths of magnetic field at the testing points T1, T2, T3, T4, T5 and T6 next to the e-beam tools 200 were measured. The readings of the testing points T1, T2, T3, T4, T5 and T6 were found to be 0.8 mG at 60 Hz, 0.8 mG at 60 Hz, 0.7 mG at 60 Hz, 0.6 mG at 60 Hz, 0.5 mG at 60 Hz, and 0.6 mG at 60 Hz respectively.

With reference to the board 100 as mentioned above, the embodiments of the present disclosure further provide a magnetic shielding method. The magnetic shielding method includes the following steps (it is appreciated that the sequence of the steps and the sub-steps as mentioned below, unless otherwise specified, can be adjusted according to the actual requirements, or even executed at the same time or partially at the same time):

(1) forming the board 100 having the first magnetic conductive plate 110 and the second magnetic conductive plate 120 therein. The first magnetic conductive plate 110 has the first magnetic conductive direction D1. The second magnetic conductive plate 120 has the second magnetic conductive direction D2. The first magnetic conductive direction D1 is different from the second magnetic conductive direction D2.

(2) disposing the board 100 on at least one side of the space S to at least partially shield the space S against the magnetic field from the surrounding sources.

To be more specific, the first magnetic conductive plate 110 concentrates and directs a magnetic field along the first magnetic conductive direction D1 while mitigates the magnetic field in at least one direction other than the first magnetic conductive direction D1, e.g. the direction D3 through the board 100. On the other hand, the second magnetic conductive plate 120 concentrates and directs a magnetic field along the second magnetic conductive direction D2 while mitigates the magnetic field in at least one direction other than the second magnetic conductive direction D2, e.g. the direction D3 through the board 100. In this way, when a magnetic field from the surrounding sources reaches the board 100, the magnetic field is at least partially mitigated and thus shielded by the board 100.

In order to allow the board 100 to stand and shield the space S against the magnetic field from the surrounding sources, the magnetic shielding method further includes:

(3) assembling the board 100 with at least one frame 300 to be a partition wall for the space S.

In some embodiments, the magnetic shielding method further includes:

(4) assembling the board 100 with at least one post 400 to be a screen for the space S.

On the other hand, in order to enhance the significance of the magnetic shielding method, the magnetic shielding method further includes:

(5) operating a magnetism sensitive operation in the space S.

According to various embodiments of the present disclosure, since the first magnetic conductive plate 110 has the first magnetic conductive direction D1 and the second magnetic conductive plate 120 has the second magnetic conductive direction D2, the first magnetic conductive plate 110 concentrates and directs a magnetic field along the first magnetic conductive direction D1 while the second magnetic conductive plate 120 concentrates and directs a magnetic field along the second magnetic conductive direction D2. On the contrary, the first magnetic conductive plate 110 mitigates the magnetic field in at least one direction other than the first magnetic conductive direction D1, e.g. the direction D3 through the board 100, while the second magnetic conductive plate 120 mitigates the magnetic field in at least one direction other than the second magnetic conductive direction D2, e.g. the direction D3 through the board 100. In this way, when the magnetic field emitted from the source reaches the board 100, the magnetic field is mitigated and thus shielded by the board 100.

According to various embodiments of the present disclosure, the board includes the first magnetic conductive plate and the second magnetic conductive plate. The first magnetic conductive plate has the first magnetic conductive direction. The second magnetic conductive plate overlaps with the first magnetic conductive plate. The second magnetic conductive plate has the second magnetic conductive direction. The first magnetic conductive direction and the second magnetic conductive direction cross.

According to various embodiments of the present disclosure, the semiconductor fabrication plant includes the housing structure, at least one magnetism sensitive tool and at least one magnetic shielding board. The magnetism sensitive tool is disposed in the housing structure. The magnetic shielding board is disposed at least partially around the magnetism sensitive tool in the housing structure.

According to various embodiments of the present disclosure, the fabrication facility includes at least one magnetism sensitive tool and at least one board. The magnetism sensitive tool is present in the space. The board is disposed on at least one side of the space. The board includes the first magnetic conductive plate and the second magnetic conductive plate therein. The first magnetic conductive plate has the first magnetic conductive direction. The second magnetic conductive plate has the second magnetic conductive direction. The first magnetic conductive direction is different from the second magnetic conductive direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A board, comprising:
   a first magnetic conductive plate having a first magnetic conductive direction; and
   a second magnetic conductive plate overlapping with the first magnetic conductive plate, the second magnetic conductive plate having a second magnetic conductive direction, wherein the first magnetic conductive direction and the second magnetic conductive direction cross.

2. The board of claim 1, wherein the first magnetic conductive plate is made of silicon steel.

3. The board of claim 1, wherein the first magnetic conductive plate has grain orientation different from that of the second magnetic conductive plate.

4. The board of claim 1, further comprising:
   a magnetic shielding structure overlapping with the first magnetic conductive plate.

5. The board of claim 4, wherein the magnetic shielding structure is a magnetic shielding plate.

6. The board of claim 4, wherein the magnetic shielding structure is a porous magnetic shielding structure.

7. The board of claim 4, wherein the magnetic shielding structure is made of metal.

8. The board of claim 4, wherein the first magnetic conductive plate is present between the magnetic shielding structure and the second magnetic conductive plate.

9. The board of claim 4, wherein the magnetic shielding structure is present between the first magnetic conductive plate and the second magnetic conductive plate.

\* \* \* \* \*